(12) United States Patent
Chen et al.

(10) Patent No.: US 11,800,720 B2
(45) Date of Patent: Oct. 24, 2023

(54) MEMORY CELL HAVING A TOP ELECTRODE INTERCONNECT ARRANGED LATERALLY FROM A RECESS

(71) Applicant: Taiwan Semiconductor Manufacturing Company, Ltd., Hsin-Chu (TW)

(72) Inventors: Tzu-Yu Chen, Kaohsiung (TW); Kuo-Chi Tu, Hsin-Chu (TW); Sheng-Hung Shih, Hsinchu (TW); Wen-Ting Chu, Kaohsiung (TW); Chih-Hsiang Chang, Taichung (TW); Fu-Chen Chang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/528,611

(22) Filed: Nov. 17, 2021

(65) Prior Publication Data
US 2022/0077165 A1   Mar. 10, 2022

Related U.S. Application Data

(63) Continuation of application No. 16/663,952, filed on Oct. 25, 2019, now Pat. No. 11,183,503.

(Continued)

(51) Int. Cl.
*H10B 53/00* (2023.01)
*G11C 11/22* (2006.01)
(Continued)

(52) U.S. Cl.
CPC ............ *H10B 53/00* (2023.02); *G11C 11/221* (2013.01); *H01L 28/55* (2013.01); *H01L 28/60* (2013.01); *H10B 53/10* (2023.02); *H10B 53/30* (2023.02)

(58) Field of Classification Search
CPC ...... H01L 27/11502–11514; H01L 2924/1441; H01L 45/1223; H01L 45/124;
(Continued)

(56) References Cited

U.S. PATENT DOCUMENTS

| 6,215,646 B1 | 4/2001 | Ochiai et al. |
| 6,686,620 B2 * | 2/2004 | An .......................... H01L 28/57 257/295 |

(Continued)

FOREIGN PATENT DOCUMENTS

| KR | 20050114042 A | 12/2005 |
| KR | 20210016263 A | 2/2021 |
| WO | 2013140768 A1 | 9/2013 |

OTHER PUBLICATIONS

Non-Final Office Action dated Mar. 24, 2021 for U.S. Appl. No. 16/663,952.
(Continued)

*Primary Examiner* — Younes Boulghassoul
(74) *Attorney, Agent, or Firm* — Eschweiler & Potashnik, LLC

(57) ABSTRACT

The present disclosure, in some embodiments, relates to an integrated chip. The integrated chip includes a bottom electrode disposed over a substrate. A data storage structure is disposed on the bottom electrode and is configured to store a data state. A top electrode is disposed on the data storage structure. The top electrode has interior surfaces defining a recess within an upper surface of the top electrode. A masking layer contacts a bottom of the recess and extends to over the upper surface of the top electrode. An interconnect extends through the masking layer and to the top electrode. The interconnect is directly over the upper surface of the top electrode.

20 Claims, 12 Drawing Sheets

Related U.S. Application Data

(60) Provisional application No. 62/880,816, filed on Jul. 31, 2019.

(51) Int. Cl.
  *H10B 53/10* (2023.01)
  *H10B 53/30* (2023.01)
  *H01L 49/02* (2006.01)

(58) Field of Classification Search
  CPC ..... H01L 45/1253; H01L 28/55; H01L 28/57; H01L 28/60; G11C 11/221; G11C 11/5657; G11C 14/0045; G11C 14/0027; G11C 14/0036; G11C 13/00078; H10B 53/00; H10B 53/10; H10B 53/30; H10N 70/821; H10N 70/826; H10N 70/841; H10N 70/20
  See application file for complete search history.

(56) References Cited

U.S. PATENT DOCUMENTS

| | | | |
|---|---|---|---|
| 6,777,739 B2 | 8/2004 | Agarwal et al. | |
| 7,132,300 B2 | 11/2006 | Tatsunari et al. | |
| 7,642,099 B2 | 1/2010 | Fukada et al. | |
| 9,431,603 B1 | 8/2016 | Hsieh et al. | |
| 9,799,705 B1 | 10/2017 | Yi et al. | |
| 10,164,182 B1* | 12/2018 | Trinh | G06F 12/0246 |
| 10,176,866 B1 | 1/2019 | Trinh et al. | |
| 2001/0018237 A1 | 8/2001 | Hartner et al. | |
| 2005/0170599 A1 | 8/2005 | Joo | |
| 2006/0292816 A1 | 12/2006 | Mikawa et al. | |
| 2007/0114590 A1 | 5/2007 | Ando et al. | |
| 2007/0221974 A1 | 9/2007 | Celii et al. | |
| 2009/0261434 A1 | 10/2009 | Kang et al. | |
| 2010/0051896 A1 | 3/2010 | Park et al. | |
| 2010/0187584 A1 | 7/2010 | Matsuda | |
| 2011/0169135 A1 | 7/2011 | Nakao | |
| 2011/0272664 A1* | 11/2011 | Tada | H01L 45/1253 257/4 |
| 2014/0113430 A1 | 4/2014 | Hayakawa et al. | |
| 2014/0131654 A1* | 5/2014 | Tu | H01L 45/1666 257/4 |
| 2015/0090949 A1* | 4/2015 | Chang | H01L 45/1233 257/4 |
| 2015/0144859 A1* | 5/2015 | Chen | H01L 45/12 257/4 |
| 2015/0221658 A1 | 8/2015 | Wang | |
| 2015/0262864 A1 | 9/2015 | Okamoto et al. | |
| 2015/0295172 A1* | 10/2015 | Sung | H01L 45/16 257/2 |
| 2015/0340609 A1 | 11/2015 | Banno et al. | |
| 2016/0064391 A1 | 3/2016 | Li et al. | |
| 2016/0380193 A1 | 12/2016 | Chen et al. | |
| 2017/0117467 A1 | 4/2017 | Chang et al. | |
| 2017/0207387 A1 | 7/2017 | Yang et al. | |
| 2020/0006649 A1 | 1/2020 | Jiang et al. | |
| 2020/0106011 A1 | 4/2020 | Chen et al. | |
| 2020/0395460 A1 | 12/2020 | Haratipour et al. | |
| 2021/0035992 A1 | 2/2021 | Chen et al. | |
| 2021/0184114 A1 | 6/2021 | Chang et al. | |

OTHER PUBLICATIONS

Notice of Allowance dated Jul. 13, 2021 for U.S. Appl. No. 16/663,952.

* cited by examiner

MEMORY CELL HAVING A TOP ELECTRODE INTERCONNECT ARRANGED LATERALLY FROM A RECESS

REFERENCE TO RELATED APPLICATIONS

This Application is a Continuation of U.S. application Ser. No. 16/663,952, filed on Oct. 25, 2019, which claims the benefit of U.S. Provisional Application No. 62/880,816, filed on Jul. 31, 2019. The contents of the above-referenced Patent Applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
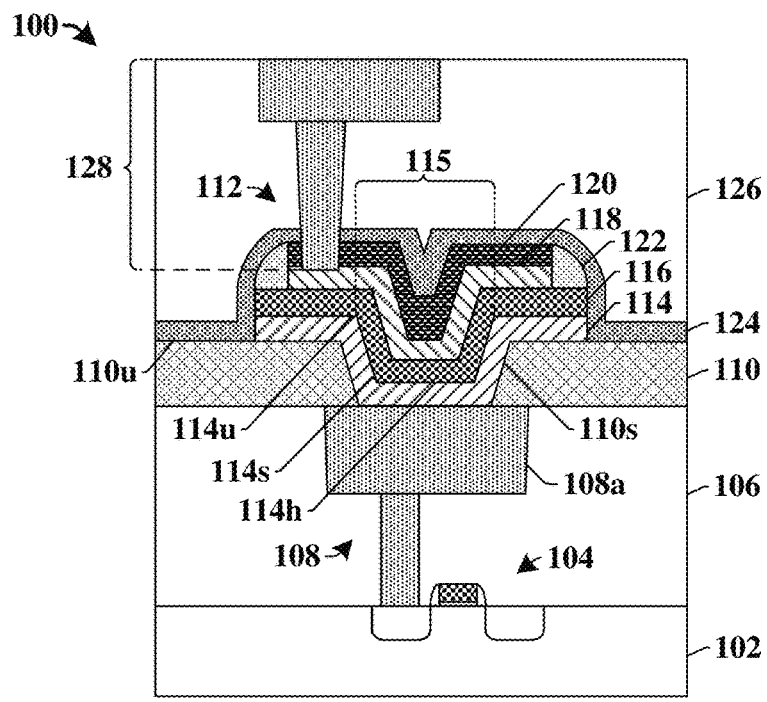
FIG. 1 illustrates a cross-sectional view of some embodiments of an integrated chip having a memory device including a bottom electrode comprising an upper surface with a recess.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random access memory (FeRAM) devices have a bottom electrode that is separated from a top electrode by a ferroelectric material. The ferroelectric material has an intrinsic electric dipole that can be switched between opposite polarities by application of an external electric field. The different polarities provide the FeRAM device with different capacitances that are representative of different data states (e.g., a logical '0' or '1'), thereby allowing the FeRAM device to digitally store data. For example, during a read operation, the different capacitances can be sensed from a voltage on a bit-line attached to a FeRAM device, so as to output a data state stored by the FeRAM device.

FeRAM devices are typically formed by depositing a lower insulating structure over a dielectric structure that surrounds a plurality of interconnect layers. The lower insulating structure is patterned to form an opening that exposes one or more of the plurality of interconnect layers. A bottom electrode layer is formed within the opening and over the lower insulating structure. A chemical mechanical planarization (CMP) process is subsequently performed on the bottom electrode layer to define a substantially planar upper surface. A ferroelectric layer is formed over the substantially planar upper surface of the bottom electrode layer and a top electrode layer is formed over the ferroelectric layer. A first patterning process is performed on the top electrode layer and the ferroelectric layer to define a top electrode and ferroelectric structure. Sidewall spacers are then formed along sides of the top electrode, followed by a second patterning process to define a bottom electrode.

The cost of using a CMP process to form the bottom electrode significantly increases a cost of forming an FeRAM device, as CMP processes are relatively expensive processes. Furthermore, it has been appreciated that a residue of a slurry used by the CMP process may remain on a substrate after the CMP process is completed. The slurry residue can accumulate over alignment marks that are used during subsequent lithographic processes, thereby obscuring the alignment marks. By obscuring the alignment marks, a photolithography process window of overlying layers is decreased, leading to a lower yield and/or reliability of FeRAM devices.

The present disclosure, in some embodiments, relates to a method of forming an FeRAM device that does not use a CMP process to form a bottom electrode. By not using a CMP process to form the bottom electrode, a cost of forming the FeRAM device can be reduced and a photolithography process window of overlying layers can be improved. In some embodiments, the resulting FeRAM device comprises a bottom electrode that generally conforms to sidewalls and an upper surface of an underlying lower insulating structure, a ferroelectric material disposed over the bottom electrode, and a top electrode over the ferroelectric material. Because the bottom electrode is formed without using a CMP process, the bottom electrode has interior sidewalls that define a first recess disposed within an upper surface of the bottom electrode. The ferroelectric material and/or the top electrode are disposed within the first recess and may also have interior sidewalls defining additional recesses.

FIG. 1 illustrates a cross-sectional view of some embodiments of an integrated chip 100 having a memory device including a bottom electrode comprising an upper surface with a recess.

The integrated chip 100 comprises an access device 104 arranged within a substrate 102. In some embodiments, the access device 104 may comprise a transistor device (e.g., a MOSFET, a bi-polar junction transistor (BJT), a high electron mobility transistor (HEMT), or the like). In some embodiments, the substrate 102 may comprise a semiconductor material (e.g., silicon, germanium, or the like). A lower dielectric structure 106 is arranged over the substrate 102 and surrounds the access device 104. The lower dielectric structure 106 further surrounds a plurality of lower interconnect layers 108, which are electrically coupled to the access device 104. A lower insulating structure 110 is disposed over the lower dielectric structure 106. The lower insulating structure 110 comprises sidewalls 110s defining an opening over an interconnect structure 108a of the plurality of lower interconnect layers 108.

A memory device 112 is disposed within the opening and over an upper surface 110u of the lower insulating structure 110. The memory device 112 comprises a data storage structure 116 arranged between a bottom electrode 114 and a top electrode 118. The data storage structure 116 is configured to store either a first data state (e.g., a '0') or a second data state (e.g., a '1') depending upon bias voltages applied to the bottom electrode 114 and the top electrode 118. For example, to store the first data state within the data storage structure 116, a first set of bias conditions may be applied to the bottom electrode 114 and the top electrode 118. Alternatively, to store the second data state within the data storage structure 116, a second set of bias conditions may be applied to the bottom electrode 114 and the top electrode 118.

The bottom electrode 114 comprises a conductive material that generally conforms to an upper surface of the interconnect structure 108a, the sidewalls 110s of the lower insulating structure 110, and an upper surface of the lower insulating structure 110. Because the conductive material of the bottom electrode 114 generally conforms to underlying layers, the bottom electrode 114 has interior sidewalls 114s and a horizontally extending surface 114h that define a first recess 115 within an upper surface 114u of the bottom electrode 114. The data storage structure 116 and/or the top electrode 118 are disposed within the first recess 115. In some embodiments, the data storage structure 116 and/or the top electrode 118 may also have interior sidewalls defining additional recesses.

A hard mask 120 is disposed over the memory device 112 and sidewall spacers 122 extend along outermost sidewalls of the top electrode 118 and the hard mask 120. A protective layer 124 covers the hard mask 120, the sidewall spacers 122, and the lower insulating structure 110. In some embodiments, the hard mask 120 and the protective layer 124 may also have interior sidewalls defining additional recesses. An upper interconnect structure 128 is disposed within an upper dielectric structure 126 over the protective layer 124. The upper interconnect structure 128 extends from an upper surface of the upper dielectric structure 126 to the top electrode 118.

The first recess 115 within the upper surface of the bottom electrode 114 is indicative that the bottom electrode 114 was formed without the use of a planarization process (e.g., a CMP process). By forming the bottom electrode 114 without using a planarization process, the bottom electrode 114 is able to be formed at a lower cost in comparison to processes that use a CMP process to form a bottom electrode. Furthermore, a photolithography process window of overlying layers may also be improved in comparison to processes that use a CMP process to form a bottom electrode.

Figure 2A:
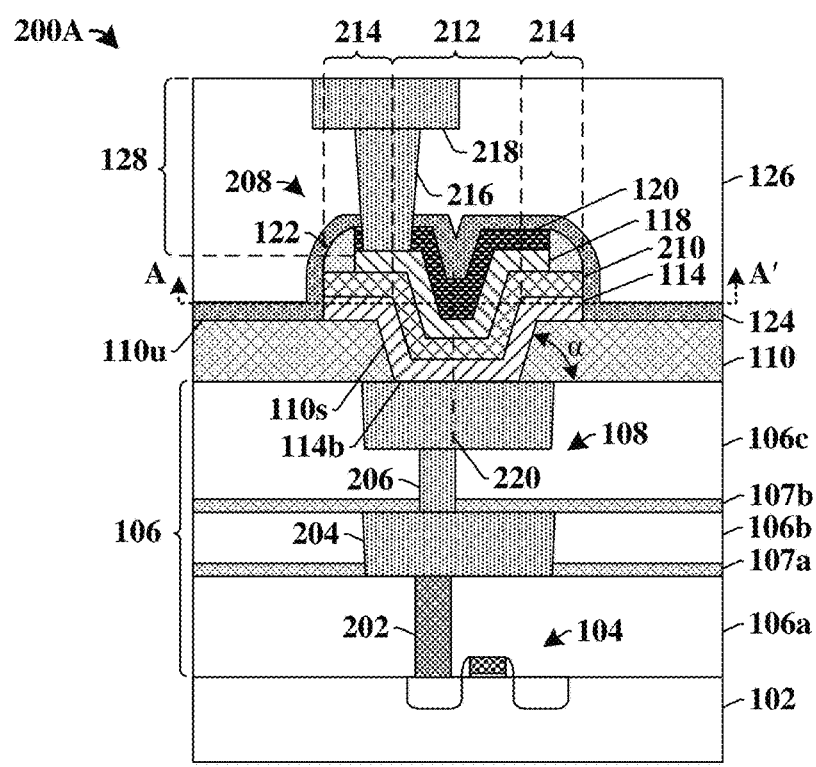
FIG. 2A illustrates a cross-sectional view of some embodiments of an integrated chip having a ferroelectric random-access memory (FeRAM) device including a bottom electrode comprising an upper surface with a recess.

FIG. 2A illustrates a cross-sectional view 200A of some embodiments of an integrated chip having a ferroelectric random access memory (FeRAM) device including a bottom electrode comprising an upper surface with a recess.

As shown in cross-sectional view 200A, the integrated chip comprises a lower dielectric structure 106 disposed over a substrate 102. The lower dielectric structure 106 comprises a plurality of lower inter-level dielectric (ILD) layers 106a-106c stacked onto one another and separated by etch stop layers 107a-107b. In some embodiments, the plurality of lower ILD layers 106a-106c may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like. In some embodiments, the etch stop layers 107a-107b may comprise silicon carbide, silicon nitride, titanium nitride, tantalum nitride, or the like.

A plurality of lower interconnect layers 108 are arranged within the lower dielectric structure 106. The plurality of lower interconnect layers 108 comprise conductive contacts 202, interconnect wires 204, and interconnect vias 206, respectively surrounded by one of the plurality of lower ILD layers 106a-106c. For example, the conductive contact 202 may be surrounded by a first lower ILD layer 106a, a first one of the interconnect wires 204 may be surrounded by a second lower ILD layer 106b, etc. In some embodiments, the interconnect wires 204 and the interconnect vias 206 respectively comprise a diffusion barrier layer surrounding a metal core. In some embodiments, the metal core may comprise copper, tungsten, aluminum, or the like. In some embodiments, the diffusion barrier layer may comprise titanium nitride, tantalum nitride, or the like. In some embodiments, the metal core and the diffusion barrier layer may have top surfaces that are substantially co-planar. In other embodiments, the diffusion barrier layer may vertically extend above outermost edges of the metal core.

A lower insulating structure 110 may be disposed over the plurality of lower ILD layers 106a-106c. In some embodiments, the lower insulating structure 110 may have a thickness in a range of between approximately 200 angstroms and approximately 400 angstroms. In other embodiments, the lower insulating structure 110 may have a thickness in a range of between approximately 225 angstroms and approximately 325 angstroms. The lower insulating structure 110 comprises sidewalls 110s defining an opening extending through the lower insulating structure 110. In some embodiments, the sidewalls 110s may be oriented at an acute angle α measured with respect to a bottom surface of the lower insulating structure 110. In some embodiments, a line extending between a top and a bottom of respective ones of the sidewalls 110s may be oriented at the acute angle α measured with respect to a bottom surface of the lower insulating structure 110. In some embodiments, the acute angle α is in a range of between approximately 40° and approximately 50°. In such embodiments, the acute angle α may limit gap fill issues during fabrication of an overlying memory device. Furthermore, the acute angle α provides for a good uniformity of the overlying layers that results in consistent performance of an overlying memory device. In various embodiments, the lower insulating structure 110 may comprise one or more of silicon oxynitride, silicon dioxide, silicon carbide, silicon nitride, Tetraethyl orthosilicate (TEOS), a low-κ dielectric, or the like.

An FeRAM device 208 is disposed over the lower insulating structure 110. The FeRAM device 208 comprises a ferroelectric material 210 arranged between a bottom electrode 114 and a top electrode 118. The bottom electrode 114, the ferroelectric material 210, and the top electrode 118 respectively have an inner region 212 laterally surrounded by an outer region 214. Layers within the inner region 212 respectively have a recessed horizontally extending surface arranged laterally between and vertically below upper surfaces of a corresponding layer within the outer region 214. For example, the bottom electrode 114 has a horizontally extending surface within the inner region 212 that is laterally between and vertically below upper surfaces of the bottom electrode 114 within the outer region 214.

Figure 2B:
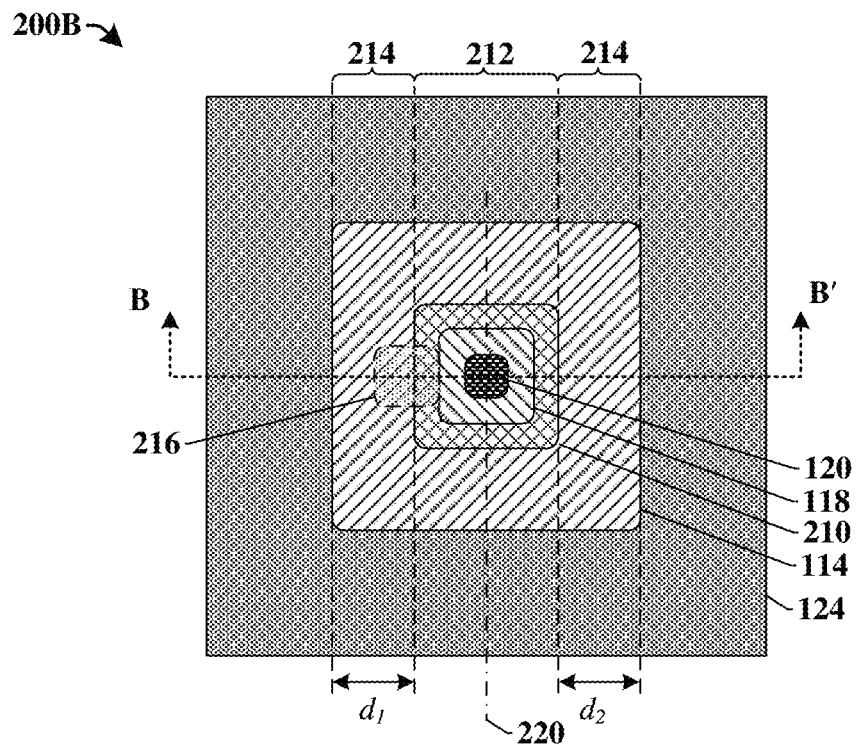
FIG. 2B illustrates a top-view of some embodiments of the integrated chip of FIG. 2A.

In some embodiments, shown in top view 200B of FIG. 2B (taken along line A-A' of FIG. 2A), the outer region 214 may continually extend in an unbroken ring around the inner region 212 when viewed in a top-view of the FeRAM device 208. In some embodiments, the upper surface of the bottom electrode 114 extends in opposing directions past opposite edges of the inner region 212 by distances, $d_1$ and $d_2$, which are substantially equal. In some such embodiments, the bottom electrode 114 is substantially symmetric about a line 220 bisecting a bottommost surface of the bottom electrode 114. In other embodiments, the distances, $d_1$ and $d_2$, may be different, so that the bottom electrode 114 is asymmetric about line 220.

Referring again to cross-sectional view 200A of FIG. 2A (taken along line B-B' of FIG. 2B), the bottom electrode 114 continuously extends from a bottommost surface 114b that is directly over the plurality of lower interconnect layers 108 to line the sidewalls 110s and an upper surface 110u of the lower insulating structure 110. The bottom electrode 114 has interior sidewalls disposed over the bottommost surface 114b. The interior sidewalls are coupled to the horizontally extending surface to define a first recess within an upper surface of the bottom electrode 114. The ferroelectric material 210 is disposed within the first recess and lines the interior sidewalls and the upper surface of the bottom electrode 114. The ferroelectric material 210 has interior sidewalls that are disposed over the bottommost surface of the bottom electrode 114 and that define a second recess within the upper surface of the ferroelectric material 210. The top electrode 118 is disposed within the second recess and lines the interior sidewalls and the upper surface of the ferroelectric material 210. In some embodiments, the top electrode 118 has interior sidewalls that are disposed over the bottommost surface of the bottom electrode 114 and that define a third recess within the upper surface of the top electrode 118.

In some embodiments, the bottom electrode 114 and the top electrode 118 may comprise one or more of titanium, tantalum, tungsten, tantalum nitride, titanium nitride, or the like. In some embodiments, the ferroelectric material 210 may comprise a metal, a metal-oxynitride, or a compound-metal-oxide. For example, in various embodiments, the ferroelectric material 210 may comprise, lead titanate, lead zirconate titanate (PZT), lead lanthanum zirconate titanate, strontium bismuth tantalate (SBT), bismuth lanthanum titanate (BLT) and bismuth neodymium titanate (BNT), or the like.

In some embodiments, the bottom electrode 114, the ferroelectric material 210, and/or the top electrode 118 may respectively have a thickness that is in a range of between approximately 50 angstroms and approximately 150 angstroms. In other embodiments, the bottom electrode 114, the ferroelectric material 210, and/or the top electrode 118 may respectively have a thickness that is equal to approximately 100 angstroms. The stated thicknesses of the bottom electrode 114, the ferroelectric material 210, and/or the top electrode 118 prevent an overall height of the FeRAM device 208 from getting large enough to present process problems within other regions of an integrated chip (e.g., within a logic region) and/or within overlying layers of an integrated chip. In some embodiments, the bottom electrode 114, the ferroelectric material 210, and/or the top electrode 118 may respectively have a substantially equal thickness between outermost sidewalls. In some alternative embodiments, the inner region 212 of the bottom electrode 114, the ferroelectric material 210, and/or the top electrode 118 may have a first thickness and the outer region 214 of the bottom electrode 114, the ferroelectric material 210, and/or the top electrode 118 may have a second thickness that is less than the first thickness.

A hard mask 120 is disposed over the top electrode 118. Sidewall spacer 122 are disposed along opposing sides of the top electrode 118 and the hard mask 120. In some embodiments, the sidewall spacers 122 may comprise a same material as the hard mask 120. For example, in some embodiments the hard mask 120 and the sidewall spacers 122 may comprise a carbide (e.g., silicon carbide), a nitride (e.g., silicon nitride), an oxide (e.g., silicon oxy-nitride), or the like. In other embodiments, the sidewall spacers 122 may comprise a different material than the hard mask 120. In some such embodiments, the sidewall spacers 122 and hard mask 120 may extend to different heights (e.g., the hard mask 120 may have a top surface that is recessed below a top surface of the sidewall spacers 122, or vice versa).

A protective layer 124 is disposed over the sidewall spacers 122 and hard mask 120. The protective layer 124 continuously extends from over the hard mask 120 to the lower insulating structure 110. In some embodiments, the protective layer 124 may comprise a carbide, an oxide, a nitride, TEOS (Tetraethyl orthosilicate), or the like. In some embodiments, the hard mask 120 and the protective layer 124 may respectively have a thickness in a range of between approximately 50 angstroms and approximately 150 angstroms. In other embodiments, the hard mask 120 and the protective layer 124 may respectively have a thickness that is equal to approximately 100 angstroms.

An upper dielectric structure 126 is arranged over the protective layer 124. The upper dielectric structure 126 may extend to within a recess defined by sidewalls of the protective layer 124. An upper interconnect structure 128 is disposed within the upper dielectric structure 126. The upper interconnect structure 128 extends from an upper surface of the upper dielectric structure 126 to the top electrode 118. In some embodiments, the upper dielectric structure 126 may comprise a carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. In various embodiments, the upper interconnect structure 128 may comprise an interconnect via 216 and/or an interconnect wire 218. In some embodiments, the upper interconnect structure 128 may comprise a conductive material, such as copper, tungsten, and/or aluminum.

During operation, bias voltages may be applied to the bottom electrode 114 and/or the top electrode 118. For example, during a write operation, one or more bias voltages can be applied to cause charge carriers (e.g., electrons and/or holes) to accumulate in the bottom electrode 114 and/or the top electrode 118. The charge carriers generate electric fields, which extend through the ferroelectric material 210. The electric fields are configured to change positions of electric dipoles within the ferroelectric material 210 depending on the bias voltages. If the positions of electric dipoles within the ferroelectric material 210 define a first polarization, the FeRAM device 208 will digitally store data as a first bit value (e.g., a logical "0"). Alternatively, if the positions of electric dipoles within the ferroelectric material 210 define a second polarization, the FeRAM device 208 will digitally store data as a second bit value (e.g., a logical "1").

Figure 3:
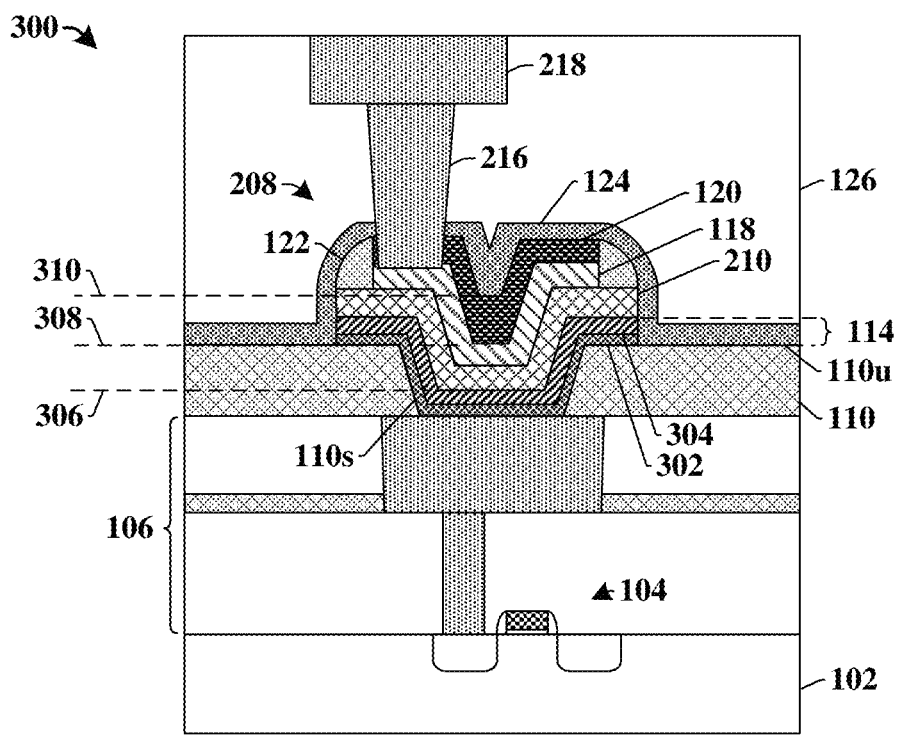
FIG. 3 illustrates a cross-sectional view of some additional embodiments of an integrated chip having an FeRAM device including a bottom electrode comprising an upper surface with a recess.

FIG. 3 illustrates a cross-sectional view of some embodiments of an integrated chip 300 having an FeRAM device including a bottom electrode comprising an upper surface with a recess.

The integrated chip 300 comprises an FeRAM device 208 disposed over a lower insulating structure 110 over a substrate 102. The FeRAM device 208 comprises a ferroelectric material 210 arranged between a bottom electrode 114 and a top electrode 118. In some embodiments, the bottom electrode 114 comprises a liner 302 and a conductive layer 304 disposed over the liner 302. The liner 302 extends along sidewalls and an upper surface of the lower insulating structure 110. In some embodiments, the liner 302 may comprise titanium nitride, tantalum nitride, or the like. In some embodiments, the conductive layer 304 may comprise titanium, tantalum, or the like.

The bottom electrode 114 has interior sidewalls disposed over a bottommost surface of the bottom electrode 114. The interior sidewalls are coupled between a horizontally extending surface of the bottom electrode 114 and an upper surface of the bottom electrode 114. In some embodiments, the horizontally extending surface of the bottom electrode 114 extends along a first horizontal plane 306 that intersects sidewalls 110s of the lower insulating structure 110. In some embodiments, the ferroelectric material 210 and the top electrode 118 continuously extend from directly above the lower insulating structure 110 to positions below a second horizontal plane 308 extending along an upper surface 110u of the lower insulating structure 110. By keeping the ferroelectric material 210 and the top electrode 118 below the second horizontal plane 308, a height of the FeRAM device 208 can be kept relatively low, thereby mitigating process problems on layers overlying the FeRAM device.

A hard mask 120 is disposed over the top electrode 118. The hard mask 120 comprises interior sidewalls that are coupled to a horizontally extending surface. In some embodiments, the horizontally extending surface extends along a third horizontal plane 310 that is below lower surfaces of the top electrode 118. In other embodiments (not shown), the third horizontal plane 310 may be above a top surface of the top electrode 118.

Figure 4A:
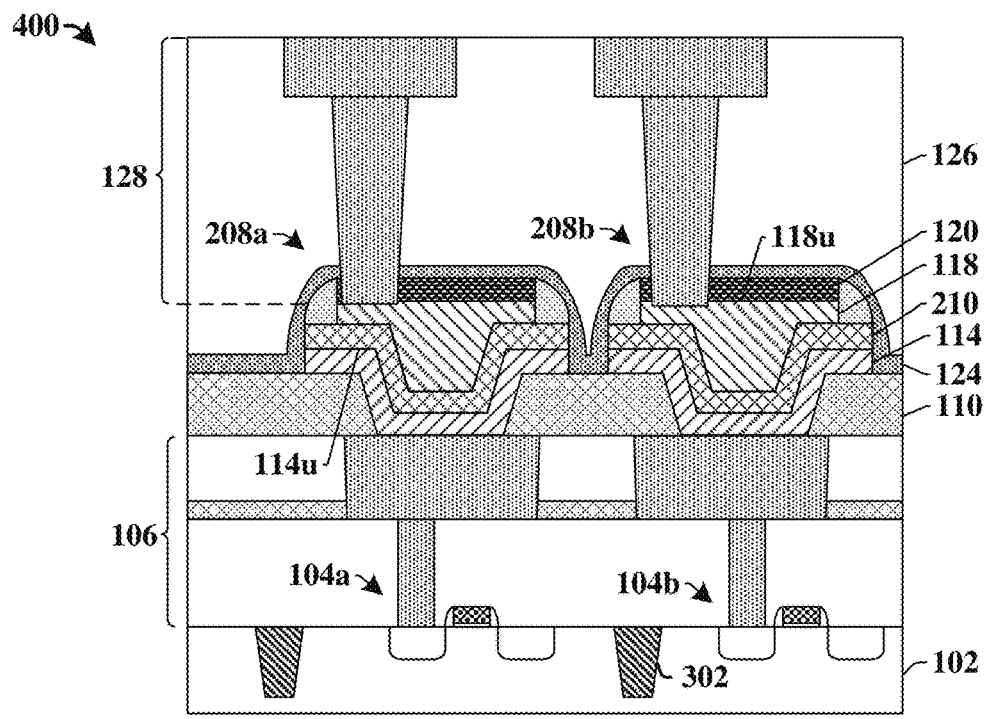
FIGS. 4A-4B illustrate cross-sectional views of some additional embodiments of integrated chips having an FeRAM device including a bottom electrode comprising an upper surface with a recess
Figure 4B:
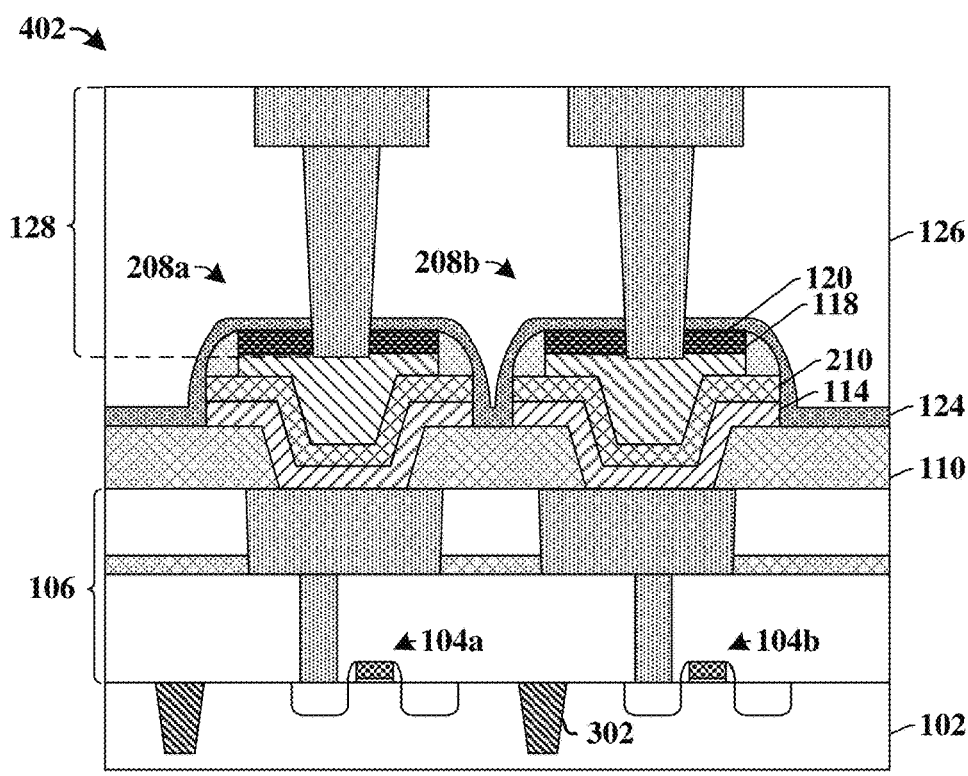

FIGS. 4A-4B illustrate cross-sectional views of some embodiments of integrated chips having an FeRAM device including a bottom electrode comprising an upper surface with a recess.

As shown in FIG. 4A, an integrated chip 400 comprises a first access device 104a and a second access device 104b disposed within a substrate 102. A first FeRAM device 208a is coupled to the first access device 104a and a second FeRAM device 208b is coupled to the second access device 104b. The first FeRAM device 208a and the second FeRAM device 208b respectively have a ferroelectric material 210 disposed between a bottom electrode 114 and a top electrode 118. The bottom electrode 114 has sidewalls that define a first recess within an upper surface of the bottom electrode 114. The ferroelectric material 210 has sidewalls that define a second recess within an upper surface of the ferroelectric material 210. The top electrode 118 is disposed within the second recess and completely fills the second recess. The top electrode 118 has an upper surface that is completely over the ferroelectric material 210. In some embodiments, the top electrode 118 has a substantially flat upper surface that continuously extends over the second recess.

An upper interconnect structure 128 extends through an upper dielectric structure 126 disposed over the first FeRAM device 208a to contact the top electrode 118. In some embodiments, the upper interconnect structure 128 may contact the top electrode 118 at a position that is directly over an upper surface 114u of the bottom electrode 114. In some additional embodiments, the upper interconnect structure 128 may contact the top electrode 118 at a position that is laterally straddles an outer edge of the upper surface 114u of the bottom electrode 114. In yet other embodiments, shown in FIG. 4B, an integrated chip 402 comprises upper interconnect structure 128 contacting the top electrode 118 at a position that is confined directly over the recess within the bottom electrode 114. It will be appreciated that having the upper interconnect structure 128 contact the top electrode 118 at a position that is directly over the recess within the bottom electrode can mitigate the risks associated with overlay errors during lithographic processes used to form the upper interconnect structure 128.

Figure 5:
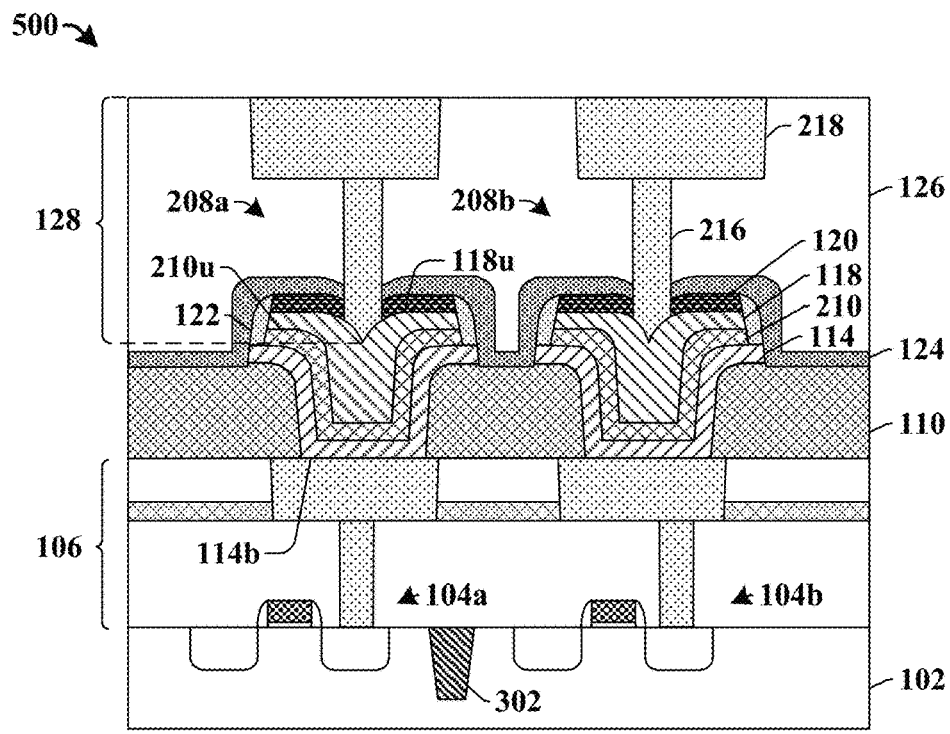
FIG. 5 illustrates a cross-sectional view of some additional embodiments of an integrated chip having an FeRAM device including a bottom electrode comprising an upper surface with a recess.

FIG. 5 illustrates a cross-sectional view of some embodiments of an integrated chip 500 having an FeRAM device including a bottom electrode comprising an upper surface with a recess.

The integrated chip 500 comprises FeRAM devices 208a-208b, respectively comprising a ferroelectric material 210 disposed between a bottom electrode 114 and a top electrode 118. A hard mask 120 and a protective layer 124 are disposed over the FeRAM devices 208a-208b.

The top electrode 118 has an upper surface 118u that laterally extends from directly over an upper surface 210u of the ferroelectric material 210 to directly over the bottommost surface 114b of the bottom electrode 114. In some embodiments, the upper surface 118u of the top electrode 118 is arranged completely above a top of the bottom electrode 114. In some additional embodiments, the upper surface 118u of the top electrode 118 may also be completely above a top of the ferroelectric material 210. In such embodiments, the top electrode 118 completely fills a recess within the upper surface 210u of the ferroelectric material 210. In some embodiments, the upper surface 118u of the top electrode 118 is a curved surface.

An upper interconnect structure 128 extends through the hard mask 120 and the protective layer 124 to contact the top electrode 118. In some embodiments, the upper interconnect structure 128 may contact the top electrode 118 at a location that is directly over the bottommost surface 114b of the bottom electrode 114. In such embodiments, the upper surface 118u of the top electrode 118 may be sloped so as to intersect sidewalls of the top electrode 118 at an non-zero angle measured with respect to a horizontal plane. In some embodiments, the hard mask 120 and the protective layer 124 may also have upper surfaces that are sloped so as to intersect the sidewalls of the top electrode 118 at non-zero angles measured with respect to horizontal planes. In other embodiments (not shown), the upper interconnect structure 128 may contact the top electrode 118 at a position that is laterally offset from a lowest point along the upper surface 118u of the top electrode 118.

Figure 6:
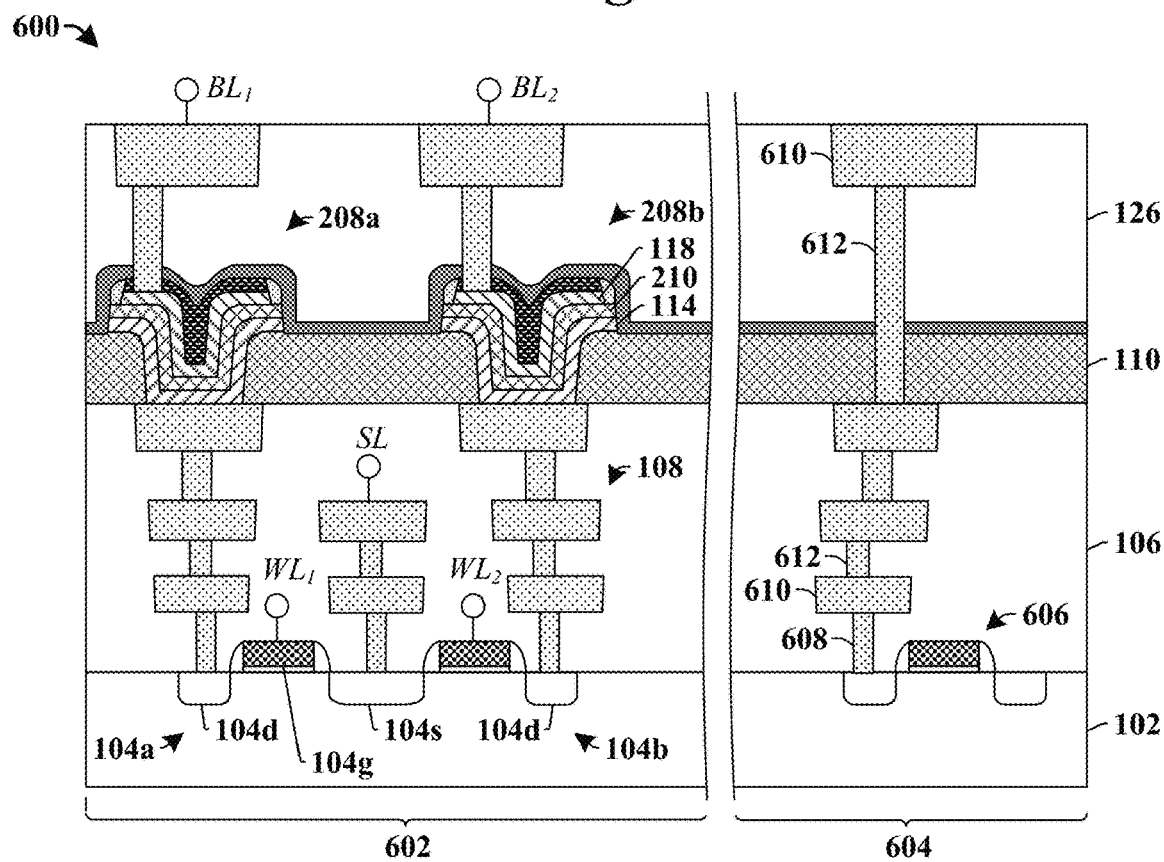
FIG. 6 illustrates a cross-sectional view of some additional embodiments of an integrated chip having an FeRAM device including a bottom electrode comprising an upper surface with a recess.

FIG. 6 illustrates a cross-sectional view of some embodiments of an integrated chip 600 having an FeRAM device including a bottom electrode comprising an upper surface with a recess.

The integrated chip 600 comprises a substrate 102 including an embedded memory region 602 and a logic region 604. Within the embedded memory region 602, a plurality of lower interconnect layers 108 are disposed within a lower dielectric structure 106. The plurality of lower interconnect layers 108 are coupled between access devices 104a-104b arranged within the substrate 102 and FeRAM devices 208a-208b arranged over a lower insulating structure 110. The FeRAM devices 208a-208b respectively comprise a ferroelectric material 210 disposed between a bottom electrode 114 and a top electrode 118.

In some embodiments, the access devices 104a-104b respectively comprise a gate electrode 104g arranged vertically over the substrate 102 and laterally between a source region 104s and a drain region 104d. The gate electrode 104g may be coupled to a word-line, $WL_1$ or $WL_2$, while the source region 104s may be coupled to a source line SL. The drain region 104d is coupled to one of the FeRAM device, 208a or 208b, which is further coupled to a bit-line, $BL_1$ or $BL_2$.

Within the logic region 604, one or more additional interconnect layers 608-612 are disposed within the lower dielectric structure 106 over the substrate 102. The one or more additional interconnect layers 608-612 comprise a conductive contact 608, an interconnect wire 610, and an interconnect via 612. The one or more additional interconnect layers 608-612 are coupled to a logic device 606 arranged within the substrate 102. In some embodiments, the logic device 606 may comprise a transistor device (e.g., a MOSFET, a bi-polar junction transistor (BJT), a high electron mobility transistor (HEMT), or the like).

FIGS. 7-17 illustrate cross-sectional views 700-1700 of some embodiments of a method of forming an integrated chip having an FeRAM device without using a planarization process to define a bottom electrode of the FeRAM device. Although FIGS. 7-17 are described in relation to a method, it will be appreciated that the structures disclosed in FIGS. 7-17 are not limited to such a method, but instead may stand alone as structures independent of the method.

Figure 7:
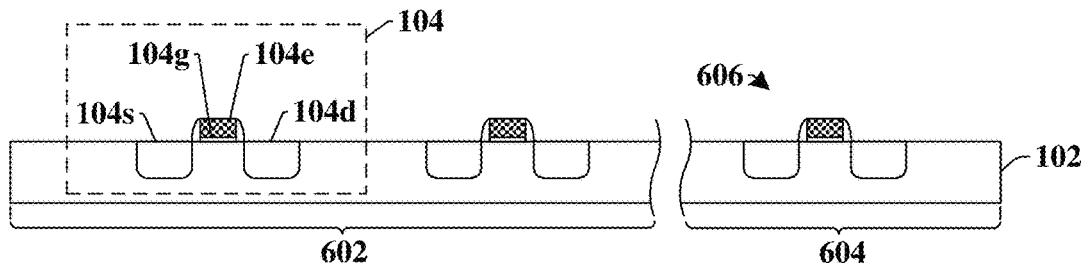
FIGS. 7-17 illustrate cross-sectional views of some embodiments of a method of forming an integrated chip having an FeRAM device without using a planarization process to define a bottom electrode of the FeRAM device.

As shown in cross-sectional view 700 of FIG. 7, a substrate 102 is provided. The substrate 102 comprises an embedded memory region 602 and a logic region 604. An access device 104 is formed within the embedded memory region 602 of the substrate 102 and a logic device 606 is formed within the logic region 604 of the substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the access device 104 and/or the logic device 606 may comprise a transistor. In some such embodiments, the access device 104 and/or the logic device 606 may be formed by depositing a gate dielectric film and a gate electrode film over the substrate 102. The gate dielectric film and the gate electrode film are subsequently patterned to form a gate dielectric (e.g., 104g) and a gate electrode (e.g., 104e). The substrate 102 may be subsequently implanted to form a source region (e.g., 104s) and a drain region (e.g., 104d) within the substrate 102 on opposing sides of the gate electrode (e.g., 104e).

Figure 8:
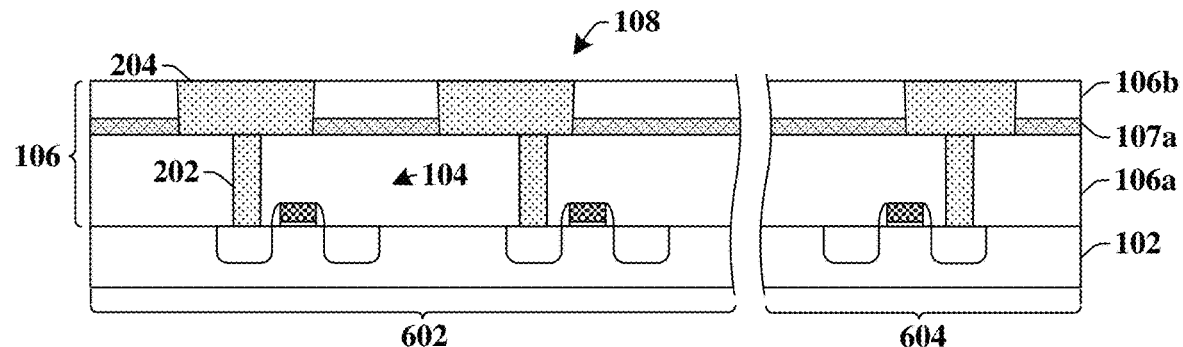

As shown in cross-sectional view 800 of FIG. 8, a plurality of lower interconnect layers 108 are formed within a lower dielectric structure 106 comprising one or more lower inter-level dielectric (ILD) layers 106a-106b over the substrate 102. In some embodiments, the one or more lower ILD layers 106a-106b may comprise a first lower ILD layer 106a and a second lower ILD layer 106b separated by a first etch stop layer 107a. In some embodiments, the plurality of lower interconnect layers 108 may comprise a conductive contact 202 and an interconnect wire 204. In some additional embodiments (not shown), the plurality of lower interconnect layers 108 may further comprise an interconnect via. The plurality of lower interconnect layers 108 may be formed by forming one of the one or more lower ILD layers 106a-106b (e.g., an oxide, a low-k dielectric, or an ultra low-k dielectric) over the substrate 102, selectively etching the lower ILD layer to define a via hole and/or a trench within the lower ILD layer, forming a conductive material (e.g., copper, aluminum, etc.) within the via hole and/or a trench, and performing a planarization process (e.g., a chemical mechanical planarization process).

Figure 9:
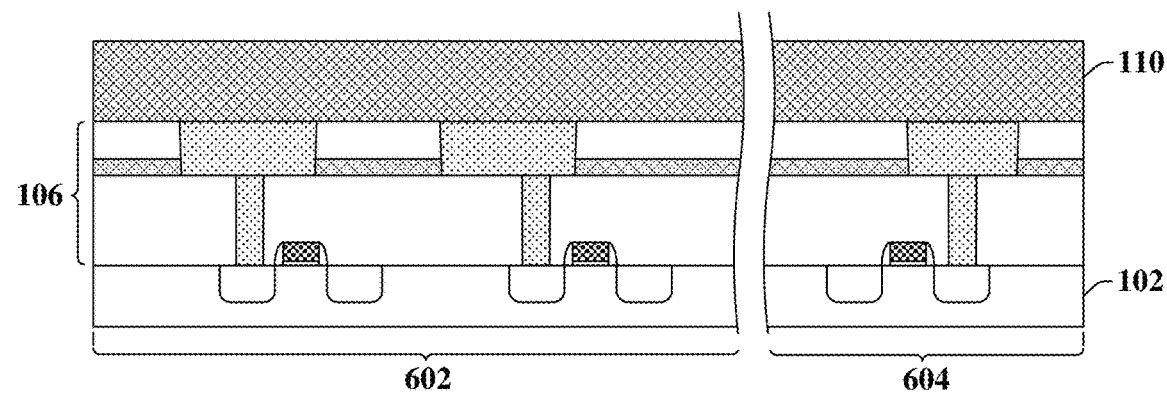

As shown in cross-sectional view 900 of FIG. 9, a lower insulating structure 110 is formed over the lower dielectric structure 106. In some embodiments, the lower insulating structure 110 may comprise one or more of an oxide, silicon nitride, silicon carbide, silicon oxynitride, TEOS, or the like. In some embodiments, the lower insulating structure 110 may be formed by one or more different deposition processes (e.g., physical vapor deposition (PVD), chemical vapor deposition (CVD), PE-CVD, atomic layer deposition (ALD), sputtering, etc.) to a thickness in a range of between approximately 200 angstroms and approximately 400 angstroms.

Figure 10:
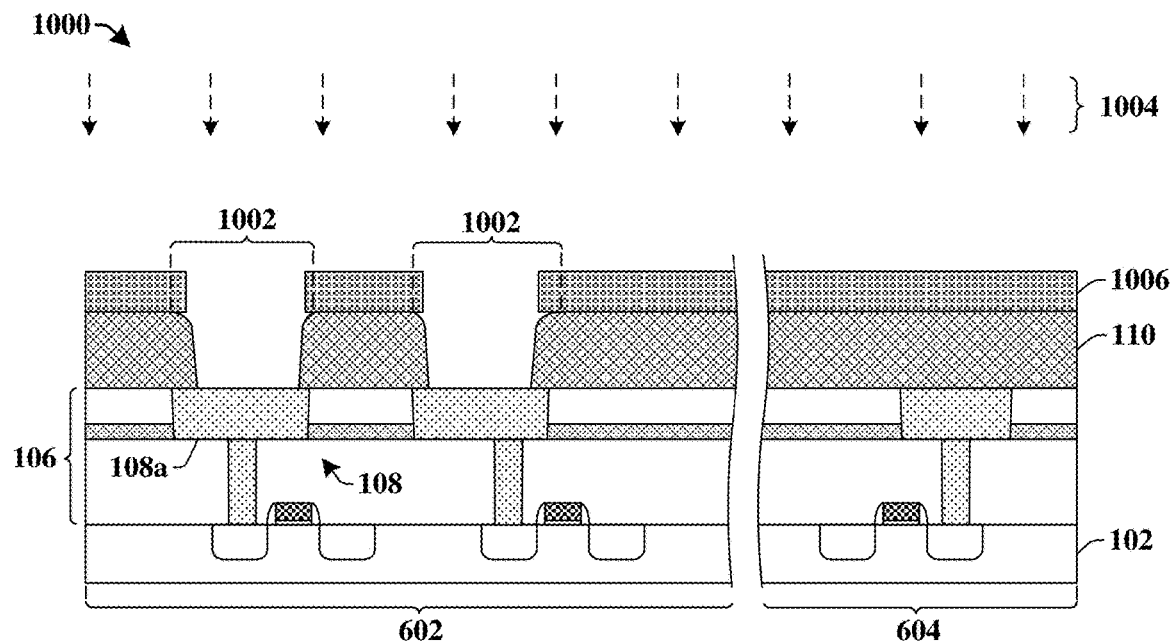

As shown in cross-sectional view 1000 of FIG. 10, the lower insulating structure 110 is selectively patterned to define a plurality of openings 1002 extending through the lower insulating structure 110. The plurality of openings 1002 expose an interconnect structure 108a of the plurality of lower interconnect layers 108. In some embodiments, the lower insulating structure 110 may be selectively patterned by exposing the lower insulating structure 110 to an etchant 1004 according to a patterned masking layer 1006 disposed on the lower insulating structure 110. In some embodiments, the patterned masking layer 1006 may comprise a photoresist material, a hard mask, or the like. In some embodiments, the etchant 1004 may comprise a dry etchant (e.g., comprising fluorine or chlorine).

Figure 11A:
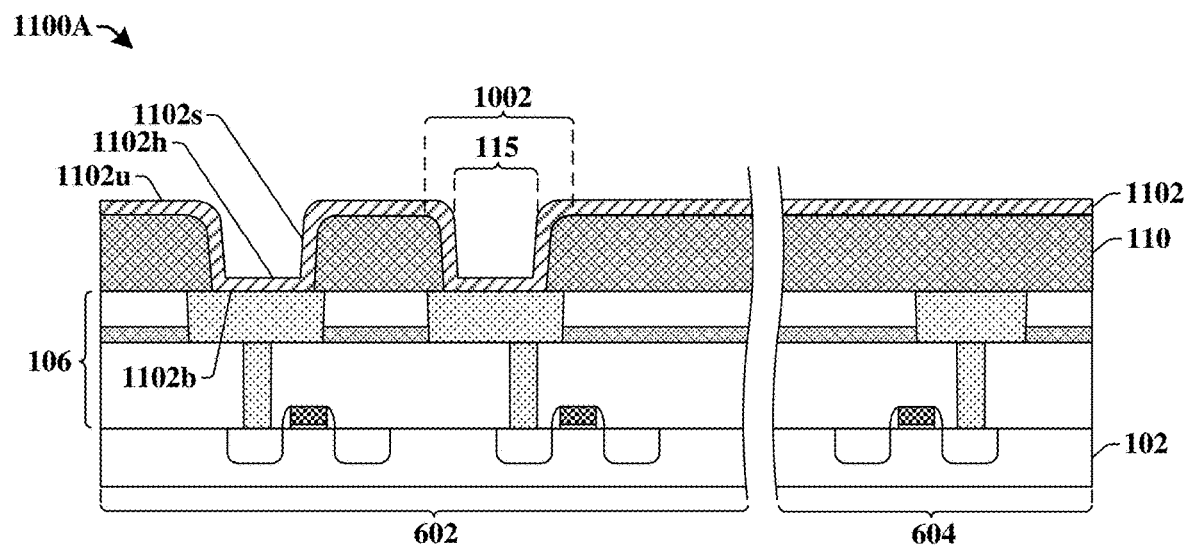

As shown in cross-sectional view 1100A of FIG. 11A, a bottom electrode layer 1102 is formed over the lower insulating structure 110 and within the openings 1002. The bottom electrode layer 1102 extends through the lower insulating structure 110 to the interconnect structure 108a. The bottom electrode layer 1102 has sidewalls 1102s and a horizontally extending surface 1102h that define a recess 115 within an upper surface 1102u of the bottom electrode layer 1102. The recess 115 is directly over a bottommost surface 1102b of the bottom electrode layer 1102. In some embodiments, the bottom electrode layer 1102 may be formed by depositing a liner followed by depositing a conductive material. In various embodiments, the liner may comprise a glue layer configured to increase adhesion between adjacent layers and/or a diffusion barrier layer configured to prevent diffusion between adjacent layers.

Figure 11B:
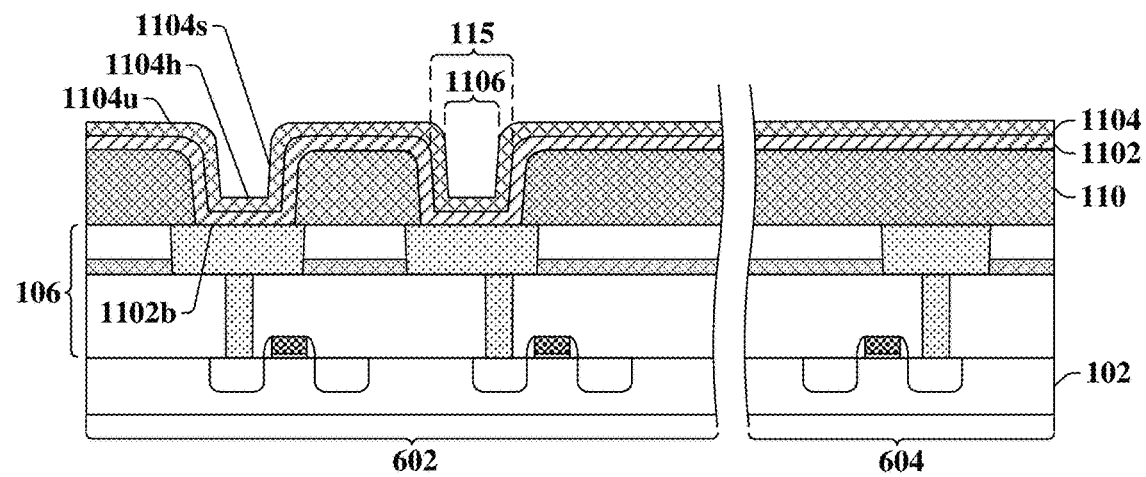

As shown in cross-sectional view 1100B of FIG. 11B, a ferroelectric layer 1104 is formed over the bottom electrode layer 1102 and within the first recess (115 of FIG. 11A). The ferroelectric layer 1104 has sidewalls 1104s and a horizontally extending surface 1104h that define a second recess 1106 within an upper surface 1104u of the ferroelectric layer 1104 and directly over the bottommost surface 1102b of the bottom electrode layer 1102.

Figure 11C:
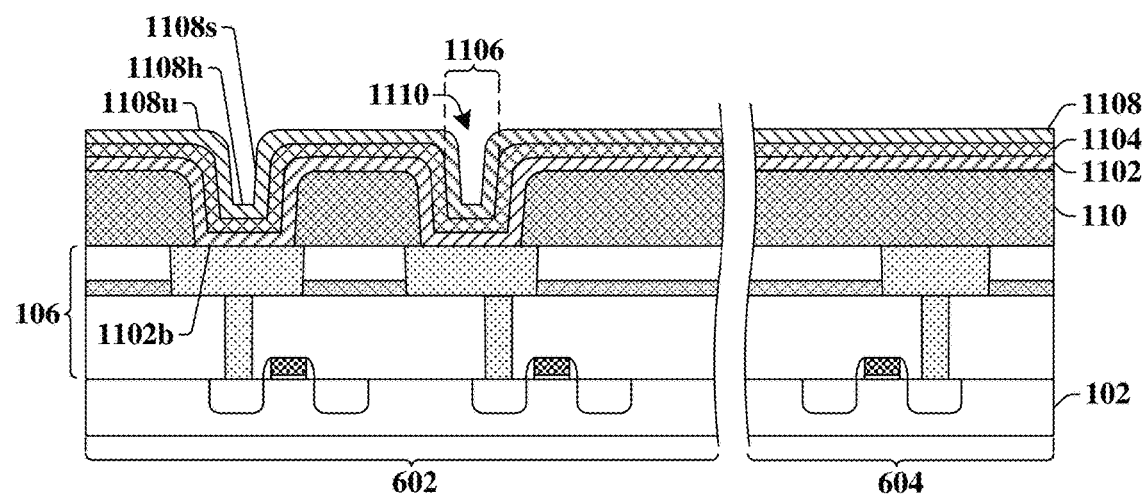

As shown in cross-sectional view 1100C of FIG. 11C, a top electrode layer 1108 is formed over the ferroelectric layer 1104 and within the second recess (1106 of FIG. 11B). The top electrode layer 1108 has sidewalls 1108s and a horizontally extending surface 1108h that define a third recess 1110 within an upper surface 1108u of the top electrode layer 1108 and directly over the bottommost surface 1102b of the bottom electrode layer 1102.

Figure 11D:
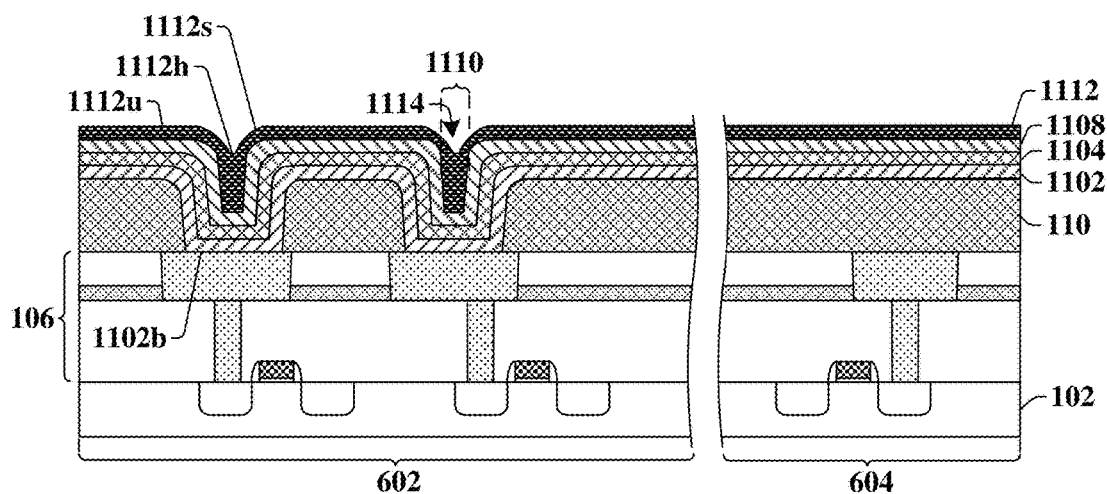

As shown in cross-sectional view 1100D of FIG. 11D, a hard mask layer 1112 is formed over the top electrode layer 1108 and within the third recess (1110 of FIG. 11C). The hard mask layer 1112 has sidewalls 1112s and a horizontally extending surface 1112h that define a fourth recess 1114 within an upper surface 1112u of the hard mask layer 1112 and directly over the bottommost surface 1102b of the bottom electrode layer 1102.

Figure 12:
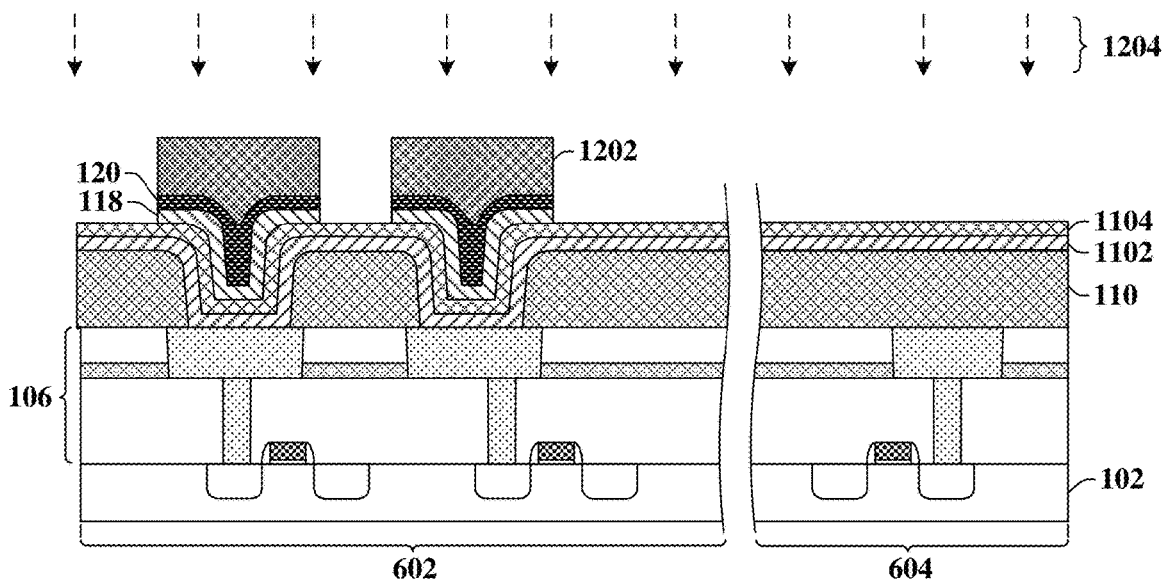

As shown in cross-sectional view 1200 of FIG. 12, a first patterning process is performed to define a top electrode 118 and a hard mask 120. The first patterning process selectively exposes the hard mask layer (1112 of FIG. 11D) and the top electrode layer (1108 of FIG. 11D) to an etchant 1204 according to a masking layer 1202 (e.g., a photoresist material, a hard mask, or the like) to define the top electrode 118 and the hard mask 120.

Figure 13:
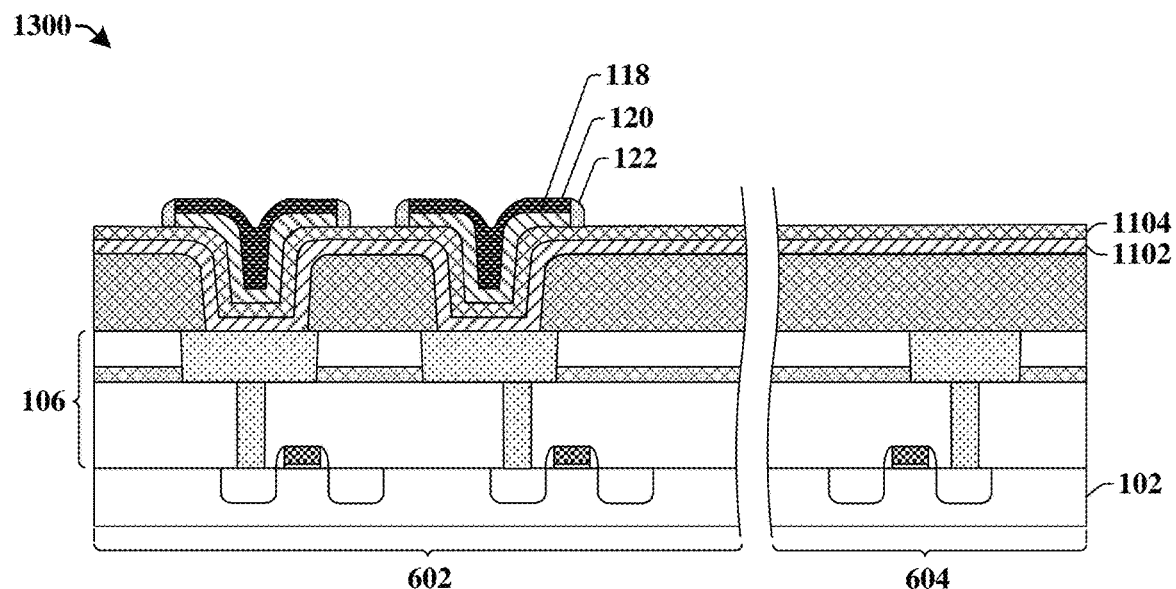

As shown in cross-sectional view 1300 of FIG. 13, sidewall spacers 122 are formed along sidewalls of the top electrode 118 and the hard mask 120. In some embodiments, the sidewall spacers 122 may completely cover sidewalls of the top electrode 118 and/or the hard mask 120. In various embodiments, the sidewall spacers 122 may comprise silicon nitride, a silicon dioxide, silicon oxy-nitride, or the like. In some embodiments, the sidewall spacers 122 may be formed by forming a spacer layer over the substrate. In some embodiments, the spacer layer may be formed using a deposition technique (e.g., PVD, CVD, PE-CVD, ALD, sputtering, etc.). The spacer layer is subsequently exposed to an etchant (e.g., a dry etchant), which removes the spacer layer from horizontal surfaces. Removing the spacer layer from horizontal surfaces leaves a part of the spacer layer along opposing sides of the top electrode 118 and the hard mask 120 as the sidewall spacers 122.

Figure 14:
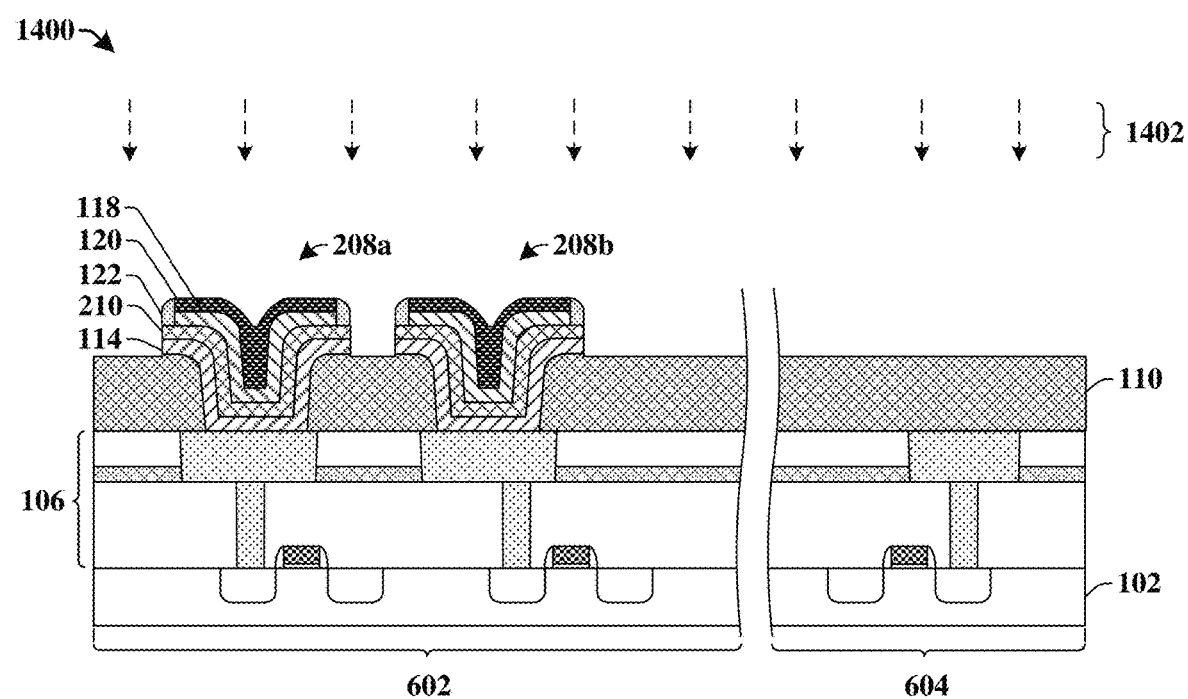

As shown in cross-sectional view 1400 of FIG. 14, a second patterning process is performed to define a first FeRAM device 208a and a second FeRAM device 208b, respectively comprising a ferroelectric material 210 disposed between a bottom electrode 114 and the top electrode 118. The second patterning process selectively exposes the ferroelectric layer (1104 of FIG. 13) and the bottom electrode layers (1102 of FIG. 13) to an etchant 1402 to define the ferroelectric material 210 and the bottom electrode 114. In some embodiments, the second patterning process may further etch the lower insulating structure 110, so as to cause the lower insulating structure 110 to have a smaller thickness laterally outside of the bottom electrode 114 than directly below the bottom electrode 114.

Figure 15:
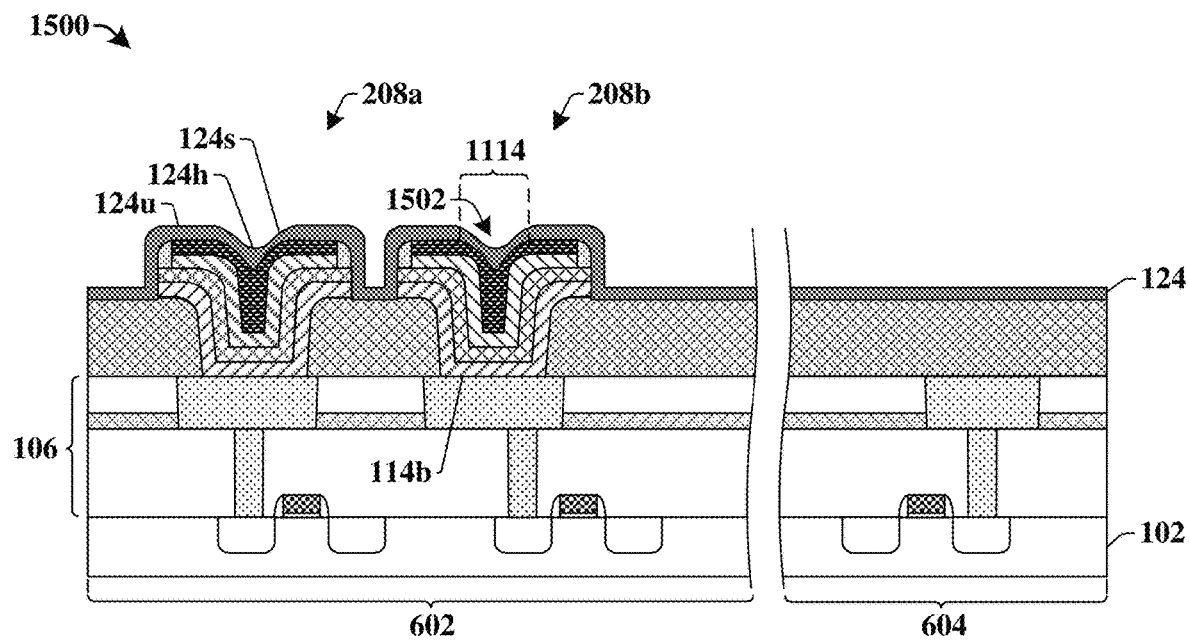

As shown in cross-sectional view 1500 of FIG. 15, a protective layer 124 is formed over the first FeRAM device 208a and the second FeRAM device 208b. The protective layer 124 has sidewalls 124s and a horizontally extending surface 124h that define a fifth recess 1502 that is within an upper surface 124u of the protective layer 124 and that is directly over a bottommost surface 114b of the bottom electrode 114. In some embodiments, the protective layer 124 may be formed using a deposition technique (e.g., PVD, CVD, PE-CVD, ALD, sputtering, etc.). In various embodiments, the protective layer 124 may comprise one or more of silicon carbide, Tetraethyl orthosilicate (TEOS), or the like.

Figure 16:
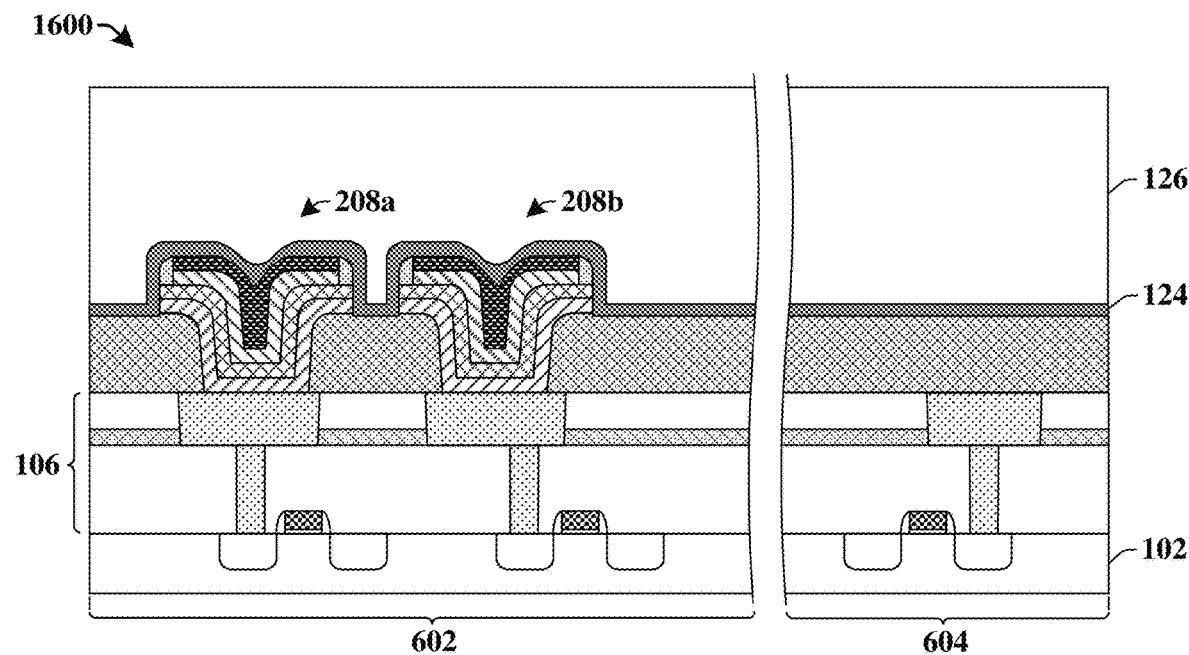

As shown in cross-sectional view 1600 of FIG. 16, an upper dielectric structure 126 is formed over the protective layer 124. The upper dielectric structure 126 is formed to cover the first FeRAM device 208a and the second FeRAM device 208b. In some embodiments, the upper dielectric structure 126 may be formed by a deposition process (e.g., PVD, CVD, PE-CVD, ALD, or the like). In various embodiments, the upper dielectric structure 126 may comprise silicon dioxide, carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like.

Figure 17:
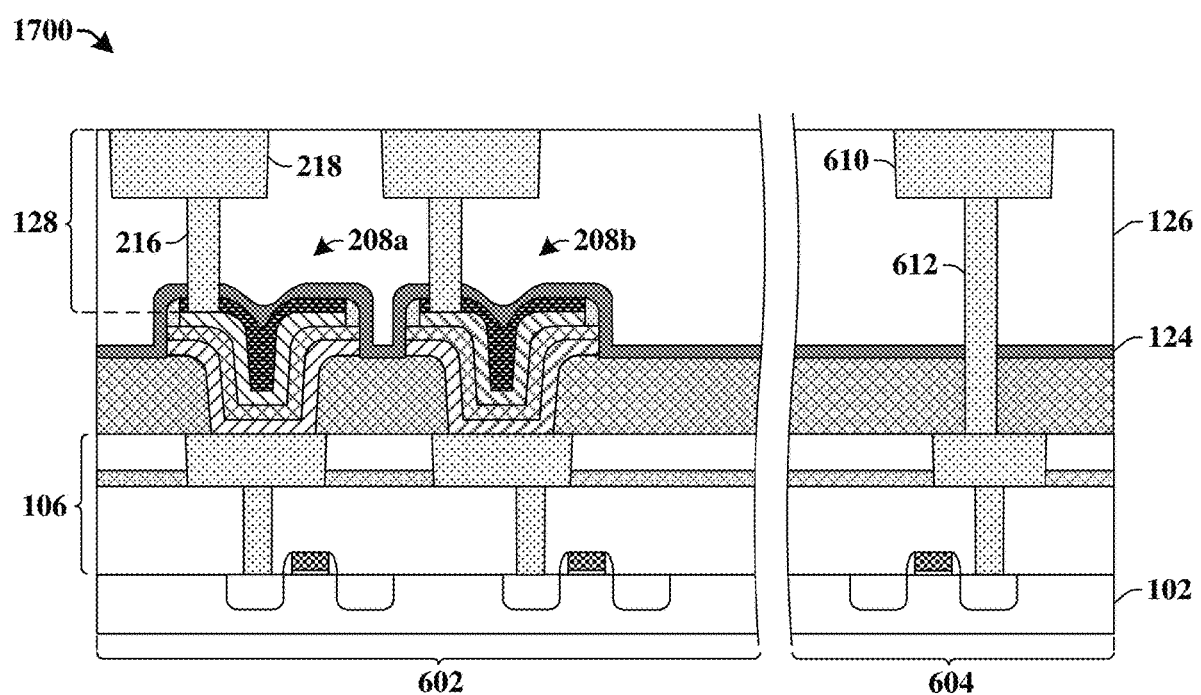

As shown in cross-sectional view 1700 of FIG. 17, an upper interconnect structure 128 is formed in the upper dielectric structure 126 within the embedded memory region 602, and one or more additional interconnect layers 610-612 are formed in the upper dielectric structure 126 within the logic region 604. In some embodiments, the upper interconnect structure 128 may comprise an interconnect via 216 and an interconnect wire 218. In some embodiments, the one or more additional interconnect layers 610-612 may comprise an interconnect via 612 and an interconnect wire 610.

The upper interconnect structure 128 and the one or more additional interconnect layers 610-612 may be concurrently formed by selectively etching the upper dielectric structure 126 to define via holes and/or trenches within the upper dielectric structure 126, forming a conductive material (e.g., copper, aluminum, etc.) within the via holes and/or trenches, and performing a planarization process (e.g., a chemical mechanical planarization process). In some embodiments, the planarization process may comprise a chemical mechanical planarization (CMP) process.

Figure 18:
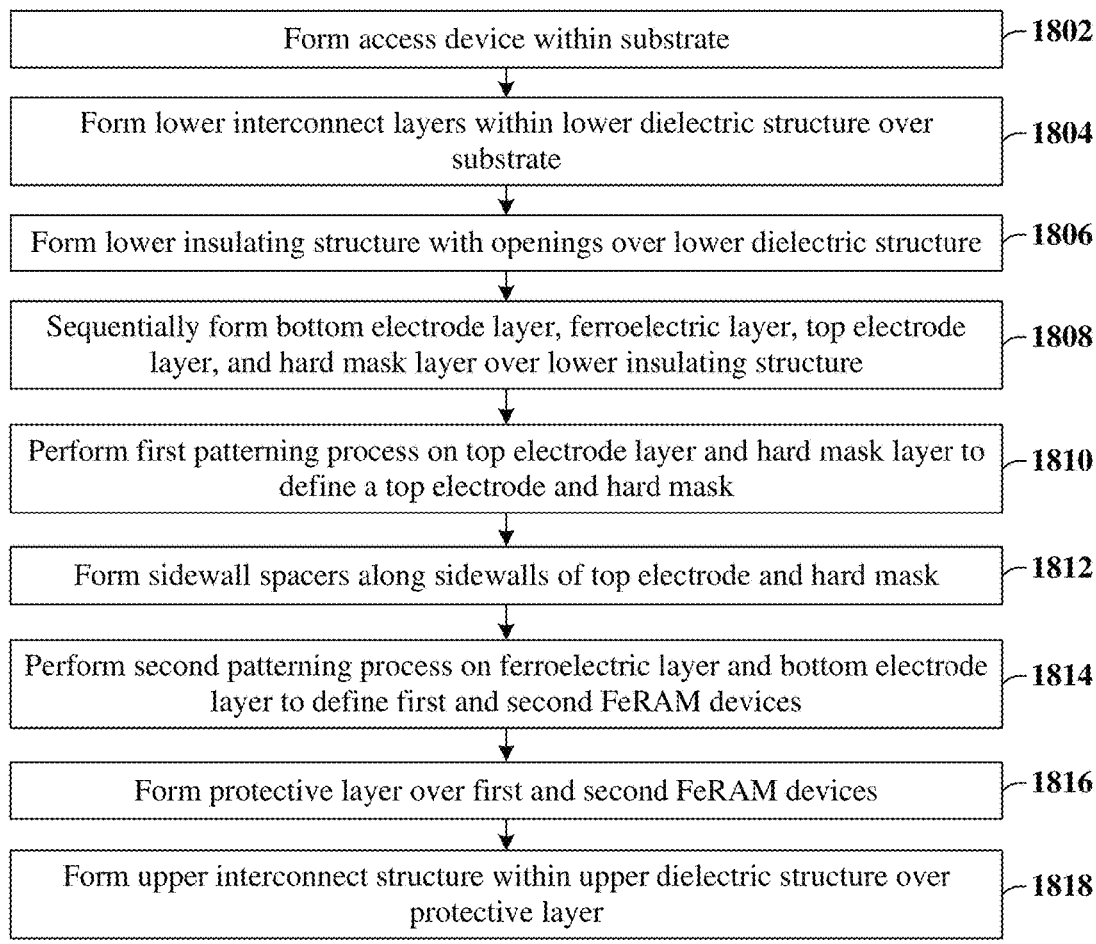
FIG. 18 illustrates a flow diagram of some embodiments of a method of forming an integrated chip having an FeRAM device without using a planarization process to define a bottom electrode of the FeRAM device.

FIG. 18 illustrates a flow diagram of some embodiments of a method 1800 of forming an integrated chip having an FeRAM device without using a planarization process to define a bottom electrode of the FeRAM device.

While method 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, an access device is formed within a substrate. FIG. 7 illustrates a cross-sectional view 700 of some embodiments corresponding to act 1802.

At 1804, a plurality of lower interconnect layers are formed within a lower dielectric structure over the substrate. FIG. 8 illustrates a cross-sectional view 800 of some embodiments corresponding to act 1804.

At 1806, a lower insulating structure is formed over the lower dielectric structure. The lower insulating structure is formed to have openings overlying an interconnect structure of the plurality of lower interconnect layers. FIGS. 9-10 illustrates cross-sectional views 900-1000 of some embodiments corresponding to act 1806.

At 1808, a bottom electrode layer, a ferroelectric layer, a top electrode layer, and a hard mask layer are sequentially formed over the lower insulating structure. FIGS. 11A-11D illustrates cross-sectional views 1100A-1100D of some embodiments corresponding to act 1808.

At 1810, a first patterning process is performed on the top electrode layer and the hard mask layer to define a top electrode and a hard mask. FIG. 12 illustrates a cross-sectional view 1200 of some embodiments corresponding to act 1810.

At 1812, sidewall spacers are formed along sidewalls of top electrode and hard mask. FIG. 13 illustrates a cross-sectional view 1300 of some embodiments corresponding to act 1812.

At 1814, a second patterning process is performed on the ferroelectric layer and the bottom electrode layer to define a first FeRAM device and a second FeRAM device, respectively having a ferroelectric material disposed between a bottom electrode and the top electrode. FIG. 14 illustrates a cross-sectional view 1400 of some embodiments corresponding to act 1814.

At 1816, a protective layer is formed over the first FeRAM device and the second FeRAM device. FIG. 15 illustrates a cross-sectional view 1500 of some embodiments corresponding to act 1816.

At 1818, an upper interconnect structure is formed within an upper dielectric structure disposed over the protective layer. FIGS. 16-17 illustrate cross-sectional views 1600-1700 of some alternative embodiments corresponding to act 1818.

Accordingly, in some embodiments, the present disclosure relates to a method of forming an FeRAM device that does not use a planarization process to define a bottom electrode. The resulting FeRAM device includes a bottom electrode comprising an upper surface with a recess.

In some embodiments, the present disclosure relates to an integrated chip. The integrated chip includes a plurality of lower interconnect layers disposed within a lower dielectric structure over a substrate; a lower insulating structure disposed over the lower dielectric structure and having sidewalls extending through the lower insulating structure; a bottom electrode arranged along the sidewalls and an upper surface of the lower insulating structure, the upper surface of the lower insulating structure extending past outermost sidewalls of the bottom electrode; a data storage structure disposed on the bottom electrode and configured to store a data state; a top electrode disposed on the data storage structure; and the bottom electrode having interior sidewalls coupled to a horizontally extending surface to define a recess within an upper surface of the bottom electrode and the horizontally extending surface of the bottom electrode is below the upper surface of the lower insulating structure. In some embodiments, a first horizontal plane extends along the horizontally extending surface of the bottom electrode and through the sidewalls of the lower insulating structure. In some embodiments, the sidewalls of the lower insulating structure are oriented at an angle of between approximately 40° and approximately 50° measured with respect to a line extending along a bottom of the lower insulating structure. In some embodiments, the bottom electrode is substantially symmetric about a line bisecting a bottommost surface of the bottom electrode. In some embodiments, the upper surface of the bottom electrode extends in opposing directions past the interior sidewalls of the bottom electrode by a substantially equal distances. In some embodiments, the integrated chip further includes an upper dielectric structure disposed over the top electrode and the lower insulating structure, and an upper interconnect structure extending from an upper surface of the upper dielectric structure to the top electrode. In some embodiments, the upper interconnect structure contacts the top electrode at a position that is directly above a bottommost surface of the bottom electrode. In some embodiments, the integrated chip further includes a hard mask disposed over the top electrode, the hard mask disposed along interior sidewalls of the top electrode that define a second recess within an upper surface of the top electrode. In some embodiments, the integrated chip further includes sidewall spacers disposed over the data storage structure and completely covering outermost sidewalls of the top electrode and the hard mask. In some embodiments, the integrated chip further includes a protective layer disposed over the hard mask, the protective layer disposed along interior sidewalls of the hard mask that define a third recess within an upper surface of the hard mask. In some embodiments, the upper dielectric structure is disposed along interior sidewalls of the protective layer that define a fourth recess within an upper surface of the protective layer.

In other embodiments, the present disclosure relates to an integrated chip. The integrated chip includes a plurality of lower interconnect layers disposed within a lower dielectric structure over a substrate; a lower insulating structure disposed over the lower dielectric structure and having sidewalls defining an opening; a ferroelectric random access memory (FeRAM) device extending through the opening to the plurality of lower interconnect layers, the FeRAM device including a bottom electrode arranged along the sidewalls and an upper surface of the lower insulating structure and having interior sidewalls coupled to a horizontally extending surface to define a first recess within an upper surface of the bottom electrode, a ferroelectric material disposed on the bottom electrode, and a top electrode disposed on the ferroelectric material; and a hard mask disposed on the top electrode, the ferroelectric material, the top electrode, and the hard mask respectively having sidewalls defining a recess disposed over the bottommost surface of the bottom electrode. In some embodiments, the top electrode has an upper surface that laterally extends from directly over an upper surface of the ferroelectric material to directly over the bottommost surface of the bottom electrode, an entirety of the upper surface of the top electrode is vertically over the upper surface of the ferroelectric material. In some embodiments, the upper surface of the top electrode is a curved surface. In some embodiments, the integrated chip further includes a protective layer disposed on the hard mask, the protective layer having sidewalls defining an additional recess disposed over the bottommost surface of the bottom electrode. In some embodiments, a horizontal plane extending along the upper surface of the lower insulating structure intersects sidewalls of the top electrode. In some embodiments, the integrated chip further includes an upper interconnect structure contacting the upper surface of the top electrode at a position that is directly over the upper surface of the bottom electrode. In some embodiments, the integrated chip further includes an upper interconnect structure contacting an upper surface of the top electrode at a position that is directly over the bottommost surface of the bottom electrode. In some embodiments, the integrated chip further includes a protective layer disposed over the hard mask, the protective layer having sidewalls that intersect the upper interconnect structure at a non-zero angle measured with respect to a horizontal plane extending along an upper surface of the protective layer.

In yet other embodiments, the present disclosure relates to a method of forming an integrated chip. The method includes forming a lower insulating structure over a plurality of interconnect layers within a lower dielectric structure over a substrate; removing a part of the lower insulating structure to define openings extending through the lower insulating structure to the plurality of interconnect layers; sequentially depositing a bottom electrode layer, a ferroelectric layer, a top electrode layer, and a hard mask layer over the lower insulating structure, the bottom electrode layer, the ferroelectric layer, the top electrode layer, and the hard mask layer respectively having sidewalls defining a recess disposed over a bottommost surface of the bottom electrode layer; and patterning the bottom electrode layer, the ferroelectric layer, the top electrode layer, and the hard mask layer to define a ferroelectric random access memory (FeRAM) device having a ferroelectric material disposed between a bottom electrode and a top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a bottom electrode disposed over a substrate;
   a data storage structure disposed on the bottom electrode and configured to store a data state;
   a top electrode disposed on the data storage structure, wherein the top electrode has interior surfaces that are vertically below an upper surface of the top electrode and that form a recess within the upper surface of the top electrode;
   a masking layer contacting a bottom of the recess and extending to over the upper surface of the top electrode; and
   an interconnect extending through the masking layer and to the top electrode, wherein the interconnect has a bottommost surface that is laterally outside of the recess.

2. The integrated chip of claim 1, wherein the upper surface of the top electrode is a topmost surface of the top electrode.

3. The integrated chip of claim 1, wherein a part of the masking layer that is within the recess vertically extends past lower surfaces of the top electrode and the data storage structure.

4. The integrated chip of claim 1, further comprising:
   an upper insulating layer disposed over and along exterior sidewalls of the masking layer; and
   an inter-level dielectric (ILD) layer arranged over and along exterior sidewalls of the upper insulating layer, wherein the interconnect extends through the ILD layer, the upper insulating layer, and the masking layer.

5. The integrated chip of claim 1, wherein the masking layer comprises silicon carbide.

6. The integrated chip of claim 1, further comprising:
   one or more lower interconnects surrounded by a lower dielectric layer, wherein the bottom electrode contacts the one or more lower interconnects; and
   a lower insulating structure disposed over the lower dielectric layer and having sidewalls that laterally surround the bottom electrode.

7. The integrated chip of claim 6, wherein the data storage structure is directly between the sidewalls of the lower insulating structure.

8. The integrated chip of claim 6, wherein one of the sidewalls of the lower insulating structure is oriented at an acute angle measured with respect to a bottom surface of the lower insulating structure as measured through the lower insulating structure, the acute angle being in a range of between approximately 40° and approximately 50°.

9. An integrated chip, comprising:
   a lower insulating structure disposed over a lower dielectric structure and having sidewalls extending through the lower insulating structure to a lower interconnect;
   a bottom electrode arranged along the sidewalls and an upper surface of the lower insulating structure;
   a data storage structure disposed on the bottom electrode and configured to store a data state;
   a top electrode disposed on the data storage structure;
   a hard mask disposed on the top electrode, wherein the hard mask has a bottommost surface that is laterally between sidewalls of the top electrode and that is vertically below a lower surface of the top electrode; and
   an interconnect extending through the hard mask and contacting the top electrode laterally outside of the bottommost surface of the top electrode, wherein the interconnect is disposed within an upper dielectric structure that is over the lower insulating structure and that extends to a top surface of the top electrode.

10. The integrated chip of claim 9, wherein the bottommost surface of the hard mask is vertically below a top surface of the data storage structure.

11. The integrated chip of claim 9, wherein the bottom electrode has an upper surface that contacts the data storage structure along a horizontally extending interface that is below the upper surface of the lower insulating structure.

12. The integrated chip of claim 9, further comprising:
   an inter-level dielectric layer disposed directly over the lower insulating structure and laterally surrounding the data storage structure.

13. The integrated chip of claim 9, wherein the sidewalls of the top electrode face one another.

14. The integrated chip of claim 9, wherein the data storage structure has an upper surface that is directly between the sidewalls of the lower insulating structure.

15. An integrated chip, comprising:
- a bottom electrode arranged along sidewalls and an upper surface of a lower insulating structure over a substrate;
- a data storage structure disposed on the bottom electrode and configured to store a data state;
- a top electrode disposed on the data storage structure;
- an interconnect disposed within an upper dielectric structure over the top electrode, a bottommost surface of the interconnect contacting the top electrode; and
- wherein an imaginary horizontal line, which extends through the top electrode, intersects an interface between a sidewall of the bottom electrode and a sidewall of the data storage structure directly below the bottommost surface of the interconnect, the imaginary horizontal line being parallel to an upper surface of the substrate that faces the bottom electrode.

16. The integrated chip of claim 15, further comprising:
- a hard mask disposed on the top electrode, wherein the imaginary horizontal line extends along a bottom of the hard mask.

17. The integrated chip of claim 16, wherein the hard mask has a first width that is substantially equal to a second width of the top electrode.

18. The integrated chip of claim 16, wherein the hard mask has a top surface and a recessed upper surface facing away from the substrate, the interconnect contacting the top electrode above the recessed upper surface.

19. The integrated chip of claim 16, wherein the hard mask has a height that is greater than a distance between an upper surface and a lower surface of the hard mask.

20. The integrated chip of claim 16, wherein the bottom of the hard mask contacts an upper surface of the top electrode and a lower surface of the hard mask contacts a topmost surface of the top electrode.

* * * * *